(12) United States Patent
Kawashiro

(10) Patent No.: US 11,276,629 B2
(45) Date of Patent: Mar. 15, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Fumiyoshi Kawashiro, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 57 days.

(21) Appl. No.: 16/776,823

(22) Filed: Jan. 30, 2020

(65) Prior Publication Data
US 2021/0035893 A1    Feb. 4, 2021

(30) Foreign Application Priority Data

Aug. 2, 2019    (JP) .............................. JP2019-143385

(51) Int. Cl.
*H01L 23/495* (2006.01)
*H01L 23/14* (2006.01)
(Continued)

(52) U.S. Cl.
CPC ...... *H01L 23/49575* (2013.01); *H01L 23/142* (2013.01); *H01L 23/3672* (2013.01);
(Continued)

(58) Field of Classification Search
CPC ..... H01L 23/3672; H01L 24/73; H01L 24/32; H01L 2224/32245; H01L 23/15;
(Continued)

(56) References Cited

U.S. PATENT DOCUMENTS

| 2013/0134572 A1* | 5/2013 | Lenniger | H01L 24/40 257/690 |
| 2015/0255367 A1* | 9/2015 | Nakahara | H01L 23/3735 257/712 |

(Continued)

FOREIGN PATENT DOCUMENTS

| JP | 4030930 B2 | 1/2008 |
| JP | 4371151 B2 | 11/2009 |

(Continued)

OTHER PUBLICATIONS

Yusuke Sekino et al., "3.3kV SiC Hybrid Module with High Power Next Core (HPnC) Package," PCIM Europe 2018, pp. 1001-1008.
(Continued)

*Primary Examiner* — Jasmine J Clark
(74) *Attorney, Agent, or Firm* — Allen & Overy LLP

(57) ABSTRACT

A semiconductor device according to embodiments includes a first base material having a first side surface, a first semiconductor chip provided above the first base material, a first insulating plate provided between the first base material and the first semiconductor chip, a first metal plate provided between the first insulating plate and the first semiconductor chip, a first bonding material provided between the first metal plate and the first semiconductor chip, the first bonding material bonding the first metal plate and the first semiconductor chip, a second bonding material provided between the first base material and the first insulating material, the second bonding material bonding the first base material and the first insulating plate, a second base material having a second side surface, a second semiconductor chip provided above the second base material, a second insulating plate provided between the second base material and the second semiconductor chip, a second metal plate provided between the second insulating plate and the second semiconductor chip, a third bonding material provided between (Continued)

the second metal plate and the second semiconductor chip, the third bonding material bonding the second metal plate and the second semiconductor chip, a fourth bonding material provided between the second base material and the second insulating plate, the fourth bonding material bonding the second base material and the second insulating plate, and a first base bonding portion provided between the second side surface and the first side surface and bonded to the first side surface and the second side surface.

16 Claims, 13 Drawing Sheets

(51) Int. Cl.
    *H01L 23/00*    (2006.01)
    *H01L 23/367*    (2006.01)

(52) U.S. Cl.
    CPC .............. *H01L 24/32* (2013.01); *H01L 24/48* (2013.01); *H01L 24/73* (2013.01); *H01L 2224/32245* (2013.01); *H01L 2224/32502* (2013.01); *H01L 2224/48175* (2013.01); *H01L 2224/73265* (2013.01)

(58) Field of Classification Search
    CPC ......... H01L 2224/73245; H01L 25/072; H01L 23/367; H01L 25/113; H01L 25/0655; H01L 25/162; H01L 23/50; H01L 23/49575; H01L 2224/32151; H01L 2224/73265; H01L 24/83; H01L 2224/48175; H01L 24/48; H01L 23/142; H01L 2224/32502

See application file for complete search history.

(56) References Cited

U.S. PATENT DOCUMENTS

| | | | |
|---|---|---|---|
| 2015/0380335 A1* | 12/2015 | Takematsu | H01L 25/18 257/77 |
| 2018/0214974 A1 | 8/2018 | Fujii et al. | |

FOREIGN PATENT DOCUMENTS

| | | |
|---|---|---|
| JP | 2011-198804 A | 10/2011 |
| JP | 4972503 B2 | 7/2012 |
| JP | 5344888 B2 | 11/2013 |
| JP | 2017-228713 A | 12/2017 |
| JP | 2018-81980 A | 5/2018 |
| JP | 2018-110218 A | 7/2018 |
| JP | 2018-122342 A | 8/2018 |
| JP | 2018-122343 A | 8/2018 |
| JP | 2018-122344 A | 8/2018 |
| WO | 2017-022184 A1 | 2/2017 |
| WO | 2018-143333 A1 | 8/2018 |
| WO | 2018-143334 A1 | 8/2018 |
| WO | 2018-143335 A1 | 8/2018 |

OTHER PUBLICATIONS http://iseljp/ben/ben3-iw.htm; "What is Friction Stir Welding?", Feb. 9, 2017, pp. 1-3.

* cited by examiner

SEMICONDUCTOR DEVICE

CROSS-REFERENCE TO RELATED APPLICATION

This application is based upon and claims the benefit of priority from Japanese Patent Application No. 2019-143385, filed on Aug. 2, 2019, the entire contents of which are incorporated herein by reference.

FIELD

Embodiments described herein relate generally to Semiconductor Device.

BACKGROUND

Development of power semiconductor chips such as metal-oxide-semiconductor field-effect-transistors (MOSFETs) and insulated gate bipolar transistors (IGBTs) designed for power control aimed at a wide range of fields of power generation and transmission, rotating machines such as pumps and blowers, power supply devices of communication systems, factories or the like, railway using AC motors, electric vehicles, consumer electronics products and the like has been performed.

Moreover, a semiconductor device as a power module using such a power semiconductor chip has been developed. Specifications of a high current density, low loss, high heat dissipation, and the like have been required for such a semiconductor device.

DETAILED DESCRIPTION

Figure 1:
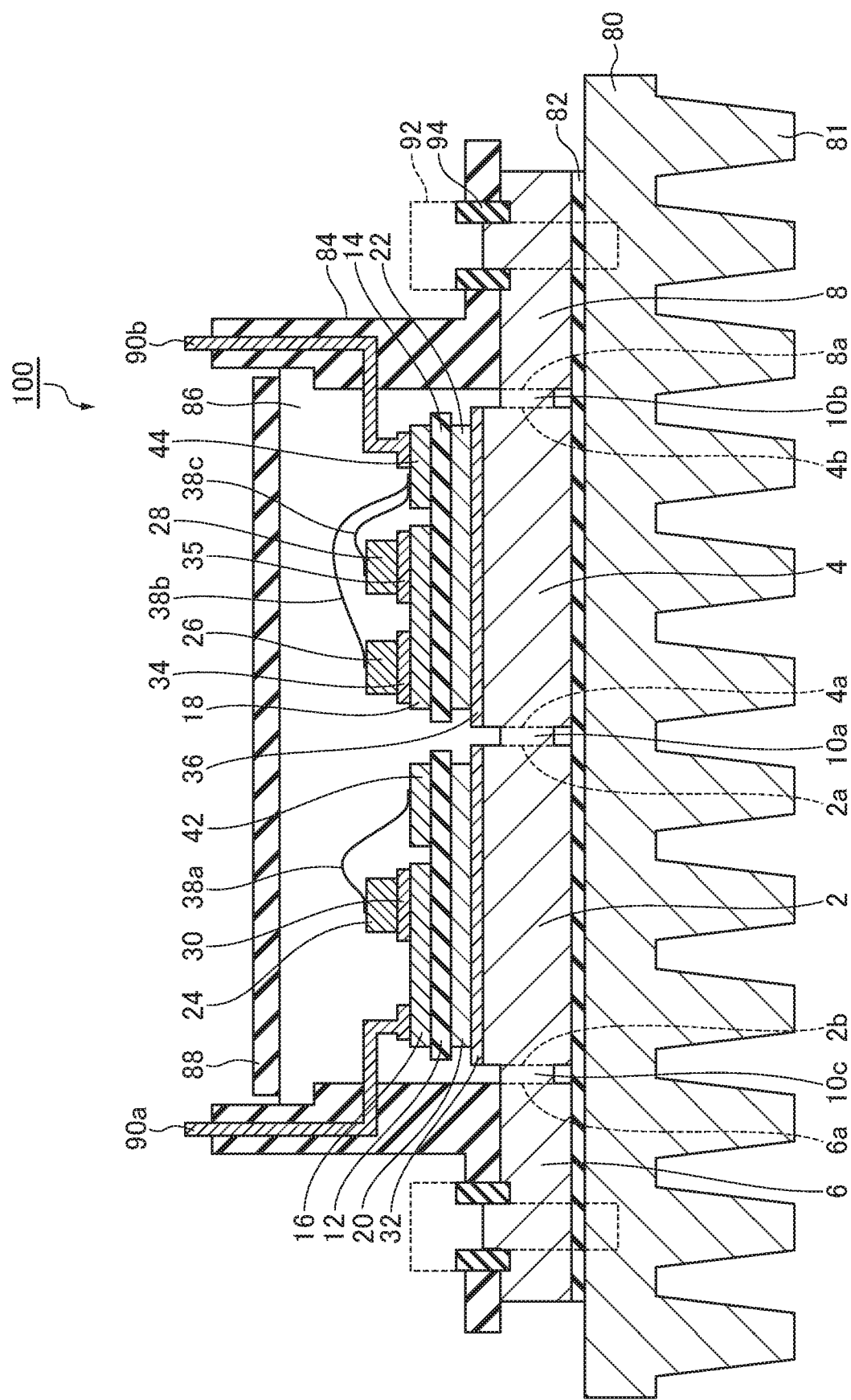
FIG. 1 is a schematic cross-sectional view of semiconductor device according to a first embodiment.

Hereinafter, embodiments will be described with reference to the accompanying drawings. In addition, in the following description, in some cases, the same or similar members are denoted by the same reference numerals. In addition, in some cases, description of the once-described member or the like is omitted as appropriate.

In the specification, in order to illustrate positional relationship of components and the like, the upward direction of the drawing is denoted by "upper", and the downward direction of the drawing is denoted by "lower". In the specification, the concept of the "upper" and the "lower" are not necessarily terms indicating the relationship based on the direction of gravity.

First Embodiment

A semiconductor device of this embodiment includes a first base material having a first side surface, a first insulating plate provided on the first base material, a first metal plate provided on the first insulating plate, a first semiconductor chip provided on the first metal plate, a first bonding material bonding the first metal plate and the first semiconductor chip, a second bonding material bonding the first base material and the first insulating plate, a second base material having a second side surface, a second insulating plate provided on the second base material, a second metal plate provided on the second insulating plate, a second semiconductor chip provided on the second metal plate, a third bonding material bonding the second metal plate and the second semiconductor chip, a fourth bonding material bonding the second base material and the second insulating plate, and a first base bonding portion provided between the first side surface and the second side surface and bonded to the first side surface and the second side surface. A semiconductor device of this embodiment includes a first base material having a first side surface; a first semiconductor chip provided above the first base material; a first insulating plate provided between the first base material and the first semiconductor chip; a first metal plate provided between the first insulating plate and the first semi conductor chip; a first bonding material provided between the first metal plate and the first semiconductor chip, the first bonding material bonding the first metal plate and the first semiconductor chip; a second bonding material provided between the first base material and the first insulating material, the second bonding material bonding the first base material and the first insulating plate; a second base material having a second side surface; a second semiconductor chip provided above the second base material; a second insulating plate provided between the second base material and the second semiconductor chip; a second metal plate provided between the second insulating plate and the second semiconductor chip; a third bonding material provided between the second metal plate and the second semiconductor chip, the third bonding material bonding the second metal plate and the second semiconductor chip; a fourth bonding material provided between the second base material and the second insulating plate, the fourth bonding material bonding the second base material and the second insulating plate; and a first base bonding portion provided between the second side surface and the first side surface and bonded to the first side surface and the second side surface.

FIG. 1 is a schematic cross-sectional view of a semiconductor device 100 of this embodiment.

The semiconductor device 100 includes a first base material 2, a second base material 4, a third base material 6, a fourth base material 8, a base bonding portion 10a (an example of the first base bonding portion), a base bonding portion 10b (an example of the second base bonding portion), a base bonding portion 10c (an example of the third base bonding portion), first insulating plate 12, a second insulating plate 14, a first metal plate 16, a second metal plate 18, a fourth metal plate 20, a fifth metal plate 22, a first semiconductor chip 24, a second semiconductor chip 26, a third semiconductor chip 28, a first bonding material 30, a second bonding material 32, a third bonding material 34, a fourth bonding material 36, a bonding wire 38a, a bonding wire 38b, a bonding wire 38c, a sixth metal plate 42, a seventh metal plate 44, a heat dissipation plate 80, a thermal interface material 82, a casing 84, a sealing material 86, a terminal 90a, a terminal 90b, screws 92, and washers 94.

The first base material 2 has a side surface 2a (an example of the first side surface) and a side surface 2b (an example of the third side surface). The second base material 4 has a side surface 4a (an example the second side surface) and a side surface 4b (an example of the fourth side surface). The third base material 6 has a side surface 6a (an example of the fifth side surface). The fourth base material 8 has a side surface 8a (an example of the sixth side surface).

The heat dissipation plate 80 has fins 81 in the lower portion. The heat dissipation plate 80 is used to dissipate heat generated from the semiconductor chip and the like to be described later.

The first base material 2, the second base material the third base material 6, and the fourth base material 8 are provided on the heat dissipation plate 80. Each of the first base material 2, the second base material 4, the third base material 6, and the fourth base material 8 is made of, for example, a metal such as Cu (copper) or Al (aluminum). In addition, each of the first base material 2, the second base material 4, the third base material 6, and the fourth base material 8 may be made of a Cu-based alloy, an Al-based alloy, or other alloys. In addition, each of the first base material 2, the second base material 4, the third base material 6, and the fourth base material 8 may be a material obtained by plating the surface of, for example, a Cu plate member with Ni (nickel) or the like. The third base material 6 and the fourth base material 8 is fixed to the heat dissipation plate 80 by using the screws 92 to be described later.

The base bonding portion 10a is provided between the side surface 2a of the first base material 2 and the side surface 4a of the second base material 4. The base bonding portion 10a bonds the side surface 2a and the side surface 4a. The base bonding portion 10b is provided between the side surface 4b of the second base material 4 and the side surface 8a of the fourth base material 8. The base bonding portion 10b bonds the side surface 4b and the side surface 8a. The base bonding portion. 10c is provided between the side surface 2b of the first base material 2 and the side surface 6a of the third base material 6. The base bonding portion 10c bonds the side surface 2b and the side surface 6a.

Herein, the base bonding portion 10a is formed by frictional slide bonding of the side surface 2a and the side surface 4a. The base bonding portion 10b is formed by, frictional slide bonding of the side surface 4b and the side surface 8a. The base bonding portion. 10c is formed by frictional slide bonding of the side surface 2b and the side surface 6a. The frictional slide (stir) bonding (friction stir welding: FSW) is a bonding method of performing bonding by rotating a part (tool) having protrusions at the tip and pressing the bonding object against the protrusions to soften and stir the bonding object by frictional heat. The bonding object is, for example, a metal. According to the frictional slide bonding, it is possible to bond the metal which is the bonding object in the solid phase by plastic flow without melting.

The fact that the base bonding portion 10a, the base bonding portion 10b, and the base bonding portion 10c are formed by frictional slide bonding can be determined by observing the bonding portion by using, for example, a microscope such as a stereomicroscope.

The fourth metal plate 20 is provided on (above) the first base material 2. The first insulating plate 12 is provided on (above) the fourth metal plate 20. The first metal plate 16 and the sixth metal plate 42 are provided on. (above) the first insulating plate 12.

The fifth metal plate 22 is provided on (above) the second base material 4. The second insulating plate 14 is provided on (above) the fifth metal plate 22. The second metal plate 18 and the seventh metal plate 44 are provided on (above) the second insulating plate 14.

The first insulating plate 12 and the second insulating plate 14 are plate members made of, for example, AlN (aluminum nitride), SiN (silicon nitride), $Al_2O_3$ (alumina, aluminum oxide), the like. The first metal plate 16, the second metal plate 18, the fourth metal plate 20, the fifth metal plate 22, the sixth metal plate 42, and the seventh metal plate 44 are metal plates made of, for example, Cu (copper) and are used as circuit wiring. Then, for example, the first metal plate 16, the fourth metal plate 20, and the sixth metal plate 42 are bonded to a surface of the first insulating plate 12 by using a brazing material or the like. For example, the first metal plate 16 and the sixth metal plate 42 are bonded to one surface of the first insulating plate 12. The fourth metal plate 20 is bonded to the other surface of the first insulating plate 12. For example, the second metal plate 18, the fifth metal plate 22, and the seventh metal plate 44 are bonded to a surface of the second insulating plate 14. For example, the second metal plate 18 and the seventh metal plate 44 are bonded to one surface of the second insulating plate 14. The fifth metal plate 22 is bonded to the other surface of the second insulating plate 14.

In the semiconductor device 100 of this embodiment, at most only one insulating plate is provided on (above) each of the base materials. In other words, a plurality of the insulating plates are not provided on (above) each of the base material. For example, the first insulating plate 12 is provided on (above) the first base material 2, and other insulating plates are not provided. In addition, the second insulating plate 14 is provided on the second base material 4, and other insulating plates are not provided.

The first semiconductor chip 24 is provided on (above) the first metal plate 16. The bonding wire 38a is provided on I') the first semiconductor chip 24 and the sixth metal plate 42. Then, the bonding wire 38a electrically connects, for example, the Al electrode (not illustrated) provided on the upper surface of the first semiconductor chip 24 and the sixth metal plate 42. The bonding wire 38a is made of, for example, Al (aluminum) and thus, contains Al.

The second semiconductor chip 26 is provided on (above) the second metal plate 18. The bonding wire 38b is provided on the second semiconductor chip 26 and the seventh metal plate 44. Then, the bonding wire 38a electrically connects, for example, the Al electrode (not illustrated) provided on the upper surface of the second semiconductor chip 26 and the seventh metal plate 44. The bonding wire 38b is made of, for example, Al, and thus, contains Al.

The third semiconductor chip 28 is provided on (above) the second metal plate 18. The bonding wire 38c is provided on the third semiconductor chip 28 and the seventh metal plate 44. Then, the bonding wire 38c electrically connects, for example, the Al electrode (not illustrated) provided on the upper surface of the third semiconductor chip 28 and the seventh metal plate 44. The bonding wire 38c is made of, for example, Al, and thus, contains Al.

Each of the first semiconductor chip 24, the second semiconductor chip 26, and the third semiconductor chip 28 preferably has a semiconductor element containing a compound semiconductor such as an. SiC (silicon carbide) or a nitride semiconductor. Herein, the nitride semiconductor is a semiconductor using n nitrogen as a group V element in a group III-V semiconductor. As the group III element, Al, Ga (gallium), or In (indium) preferably used.

As the semiconductor element using Si C, for example, SiC-IGBTs, SiC-MOSFETs, SiC-SBDs (Schottky Barrier Diodes), or the like may be exemplified. As the semiconductor element using a nitride semiconductor, for example, GaN-MOSFETs or the like may be exemplified. However, the semiconductor element may be Si-IGBTs Si-MOSFETs or Si-FRDs (Fast Recovery Diodes) or the like using a silicon (Si).

The number of semiconductor chips included in the semiconductor device 100 is three as described above, that is, the semiconductor chips are the first semiconductor chip 24, the second semiconductor chip 26 and the third semiconductor chip 28. However, the number of semiconductor chips is not limited thereto. For example, the number of semiconductor chips included in the semiconductor device 100 may be 50 or more.

The first bonding material 30 is provided between the first metal plate 16 and the first semiconductor chip 24 to bond the first metal plate 16 and the first semiconductor chip 24. The second bonding material 32 is provided between the first base material 2 and the fourth metal plate 20 to bond the first base material 2 and the fourth metal plate 20. Thus, the second bonding material 32 bonds the first base material 2 and the first insulating plate 12. The third bonding material 34 is provided between the second metal plate 18 and the second semiconductor chip 26 to bond the second metal plate 18 and the second semiconductor chip 26. The sixth bonding material 35 is provided between the second metal plate 18 and the third semiconductor chip 28 to bond the second metal plate 18 and the third semiconductor chip 28. The fourth bonding material 30 is provided between the second base material 4 and the fifth metal plate 22 to bond the second base material 4 and the fifth metal plate 22. Thus, the fourth bonding material 36 bonds the second base material 4 and the second insulating plate 14.

Herein, the first bonding material 30, the second bonding material 32, the third bonding material 34, the fourth bonding material 36, and the sixth bonding material 35 are solders, or contain solder. Then, a melting point (an example of a first melting point) of the first bonding material 30 is higher than a melting point (an example of a second melting point) of the second bonding material 32. In addition, a melting point (an example of a third melting point) of the third bonding material 34 and a melting point of the sixth bonding material 35 are higher than a melting point (an example of a fourth melting point) of the fourth bonding material 36.

As the first bonding material 30, the third bonding material 34, and the sixth bonding material 35, for example, a solder using Pb (lead), Ag (silver), or Sn (tin), having a composition of $Pb_{95}Sn_5$ or $Pb_{95}Ag_{1.5}Sn_{3.5}$, or the like, and having a melting point of about 330° C. can be used. In addition, as the second bonding material 32 and the fourth bonding material 36, for example, a solder using Sn and Sb (antimony), having an SnSb-based composition, and having a melting point of about 240° C. can be used. In addition, the type of solder is not limited thereto, but an AuSn-based solder using Au (gold) and Sn and having a melting point of about 280° C., an AuSi-based solder using Au and Si and having a melting point of about 360° C., an AuGe-based solder using Au and Ge (germanium) and having a melting point of about 360° C., or the like can be used by suitably selecting the solder having an appropriate melting point. In order to obtain good bonding, the melting points of the first bonding material 30, the third bonding material 34, and the sixth bonding material 35 are preferably higher by, for example, 50° C. or more than the melting points of the second bonding material 32 and the fourth bonding material 36.

The casing 84 is made of, for example, a resin and is provided, for example, on the third base material 6 and the fourth base material 8 so as to surround the first semiconductor chip 24, the second semiconductor chip 26, and the third semiconductor chip 28. The casing 84 is fixed on the third base material 6 and the fourth base material 8 by using the screws 92 and the washers 94. A known sealing material (gel) 86 is inserted into the casing 84 and sealed. The lid 88 is disposed on top of the sealing material 86.

One end of the terminal 90a and one end of the terminal 90b are bonded to the first metal plate 16 and the seventh metal plate 44, respectively, for example, by an ultrasonic bonding method. The terminal 90a is electrically connected to, for example, the first semiconductor chip 24 via the first metal plate 16. The terminal 90b is electrical y connected to, for example, the second semiconductor chip 26 and the third semiconductor chip 28 via the seventh metal plate 44, the bonding wire 38b, and the bonding wire 38c.

The power converted by the first semiconductor chip 24, the second semiconductor chip 26, and the third semiconductor chip 28 is used by being connected to a load or the like provided outside the casing 84 by using the terminal 90a and terminal 90h. In this manner, the terminal 90a and terminal 90b can function as power terminals.

In addition, the terminal 90a and terminal 90b are connected to the gate electrode of the semiconductor chi example, as a MOSFET or an IGBT. In this case, the other end of the terminal 90a and the other end of the terminal 90b are connected to the gate drive circuit (not illustrated). Then, the semiconductor chip is controlled according to signals generated by the gate drive circuit. Thus, the terminal 90a and terminal 90b may also function as signal terminals.

The thermal interface material (TMI) 82 is provided between the first base material 2, the second base material 4, the third base material 6, and the fourth base material 8 and the heat dissipation plate 80. The thermal interface material. 82 is, for example, a grease-like member. The thermal interface material 82 is applied on the heat dissipation plate 80. Then, the first base material 2, the second base material 4, the third base material 6, and the fourth base material 8 are disposed on the thermal interface material 82 to be in contact with the thermal interface material 82. The thermal interface material 82 buries small gaps or irregularities between the first base material 2, the second base material 4, the third base material 6, and the fourth base material 8 and the heat dissipation plate 80 to efficiently transfer the heat generated in the first semiconductor chip 24, the second semiconductor chip 26, and the third semiconductor chip 28 to the heat dissipation plate 80.

Figure 2:
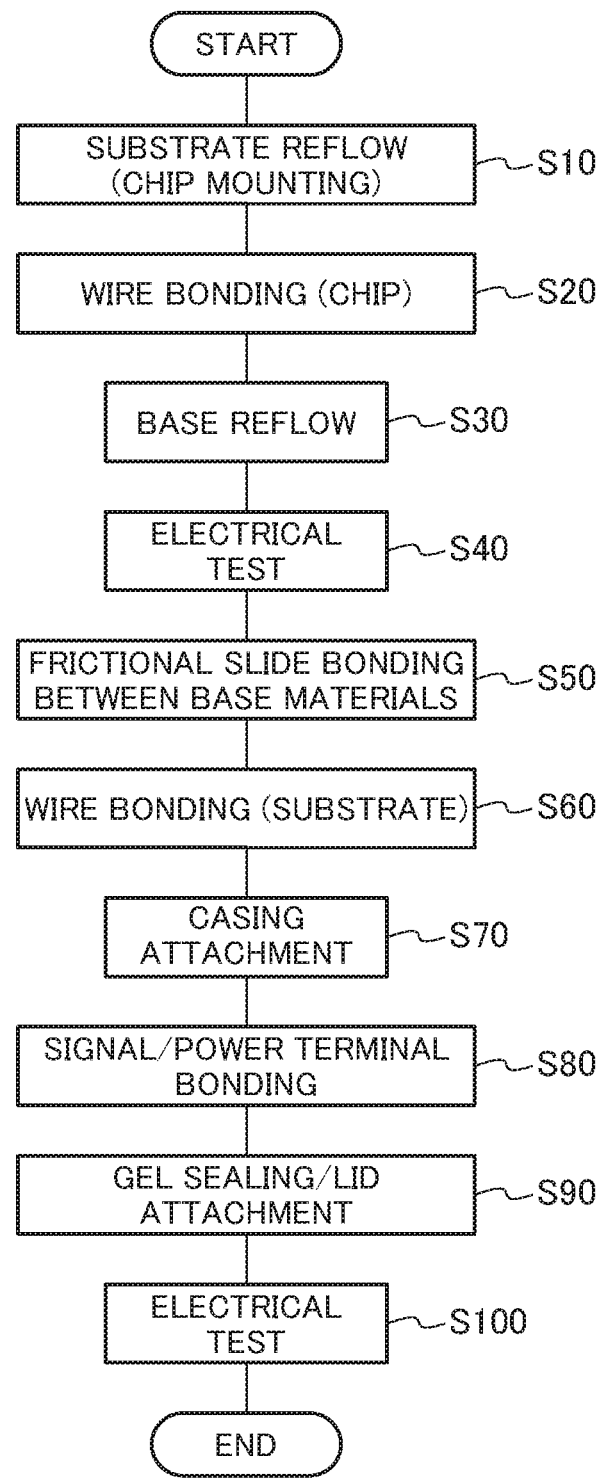
FIG. 2 is a flowchart illustrating a method of manufacturing the semiconductor device according to the first embodiment.

FIG. 2 is a flowchart illustrating a method of manufacturing the semiconductor device 100 of this embodiment.

First, as "substrate reflow (chip mounting)", the first insulating plate 12 where the first metal plate 16, the fourth metal plate 20, and the sixth metal plate 42 are bonded is prepared. Subsequent the first metal plate 16 and the first semiconductor chip 24 are bonded by using the first bonding material 30. In addition, the second insulating plate 14 where the second metal plate 18, the fifth metal plate 22, and the seventh metal plate 44 are bonded is prepared. Subsequently, the second metal plate 18 and the second semiconductor chip 26 are bonded by using the third bonding material 34, and the second metal plate 18 and the third semiconductor chip 28 are bonded by using the sixth bonding material 35. The bonding is performed, for example, in a known reflow furnace (S10).

Subsequently, as "wire bonding (chip)", the first semiconductor chip 24 and the sixth metal plate 42 are electrically connected by using the bonding wire 38a. In addition, the second semiconductor chip 26 and the seventh metal plate 44 are electrically connected by using the bonding wire 38b. In addition, the third semiconductor chip 28 and the seventh metal plate 44 are electrically connected by using the bonding wire 38c (S20).

Subsequently, as "base reflow", the upper surface of the first base material 2 and the fourth metal plate 20 are bonded by using the second bonding material 32. In addition, the upper surface of the second base material 4 and the fifth metal plate 22 are bonded by using the fourth bonding material 36. In this case, the second bonding material 32 is selected so that the melting point of the first bonding material 30 is higher than the melting point of the second bonding material 32. Accordingly, in the bonding by using the second bonding material 32, the first bonding material 30 is prevented from being melted. In addition, the fourth bonding material 36 is selected so that the melting points of the third bonding material 34 and the sixth bonding material 35 are higher than the melting point of the fourth bonding material 36. Accordingly, in the bonding by using the fourth bonding material 36, the third bonding material 34 and the sixth bonding material 35 are prevented from being melted (S30). In addition, at this step, it is assumed that each of the base materials (the first base material 2, the second base material 4, the third base material 6, and the fourth base material 8) is not bonded.

Subsequently, as "electrical test" the test of electrical characteristics of the first semiconductor chip 24, the second semiconductor chip 26, and the third semiconductor chip 28 is performed by using, for example, a commercially available semiconductor tester (S40).

Subsequently, as "frictional slide bonding between base materials", in a case where it is determined by the above-described test that the electrical characteristics of the first semiconductor chip 24, the second semiconductor chip 26, and the third semiconductor chip 28 are good, the side surface 2a of the first base material 2 and the side surface 4a of the second base material 4 are bonded by the frictional slide bonding to form the base bonding portion 10a. In addition, the side surface 2b of the first base material 2 and the side surface 6a of the third base material 6 are bonded by the frictional slide bonding to form the base bonding portion. 10c. In the side surface 4b of the second base material 4 and the side surface 8a of the fourth base material 8 are bonded by the frictional slide bonding to form the base bonding portion 10b (S50).

Subsequently, as "wire bonding (substrate)", the first semiconductor chip 24, the first metal plate 16, and the sixth metal plate 42 on the first insulating plate 12 and at least one of the second semiconductor chip 26, the third semiconductor chip 28, the second metal plate 18, and the seventh metal plate 44 on the second insulating plate 14 are electrically connected by using bonding wires (not illustrated) as appropriate (S60).

Subsequently, as "casing attachment", the casing 84 is disposed on the third base material 6 and the fourth base material 8 so as to surround the first semiconductor chip 24, the second semiconductor chip 26, and the third semiconductor chip 28. Then, the casing 84 is fixed on the third base material 6 and the fourth base material 8 (S70) by using, for example, the screws 92 and the washers 94.

Subsequently, as "signal/power terminal bonding", the terminal 90a is bonded to the first metal plate 16 by using, for example, the ultrasonic bonding method. In addition, the terminal 90b is bonded to the seventh metal plate 44 by using, for example, the ultrasonic bonding method. (S80).

Subsequently, as "gel sealing/lid attachment", the inside of the casing 84 is sealed by the sealing material (gel) 86. Then, the lid 88 is disposed on top of the sealing material 86 (S90). Accordingly, the semiconductor device 100 as a power module is obtained.

Subsequently, as "electrical test", the test of electrical characteristics of the semiconductor device 100 is performed by using, for example, a commercially available semiconductor tester (S100).

Hereinafter, functions and effects of the semiconductor device of this embodiment are described.

Figure 3:
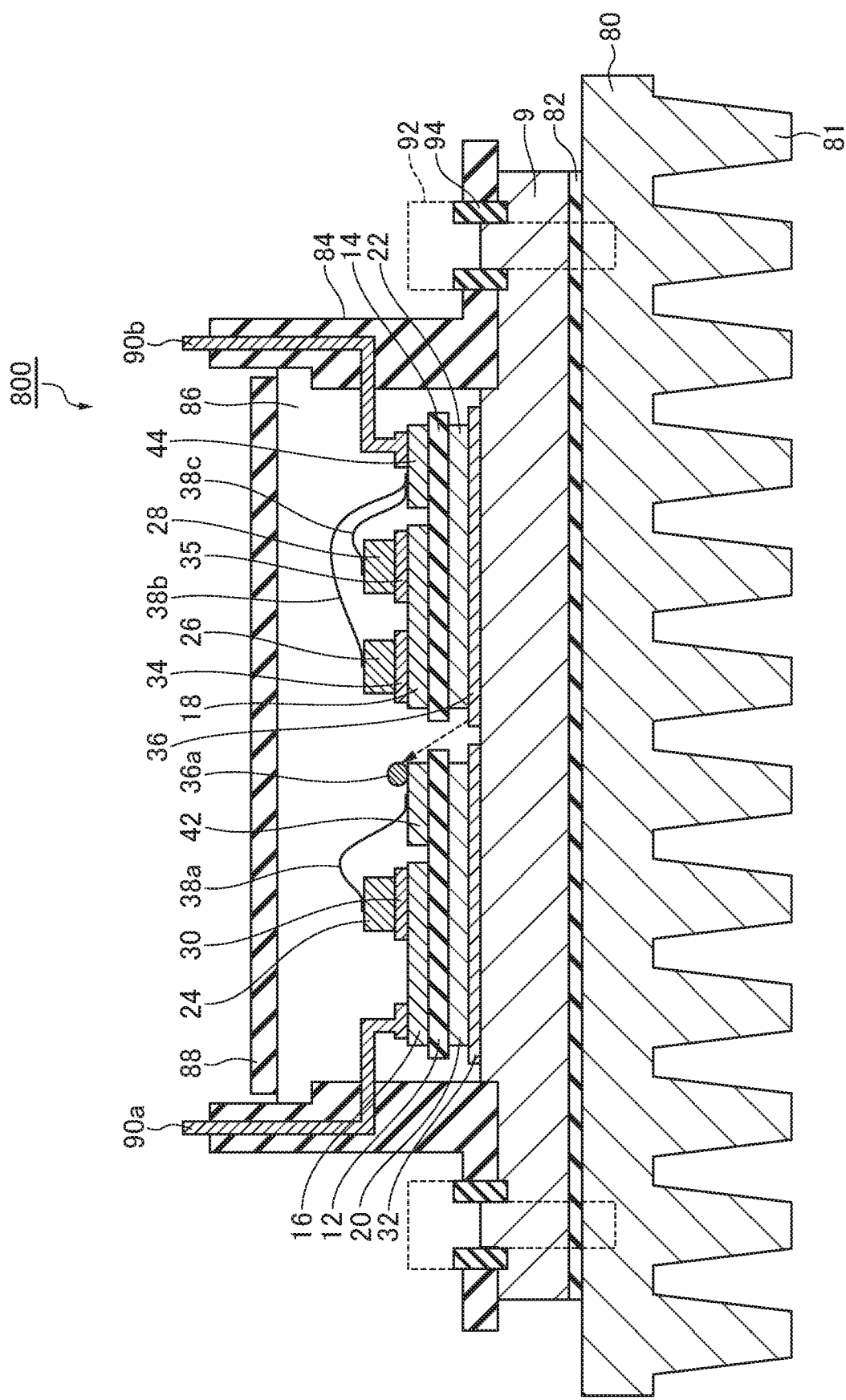
FIG. 3 is a schematic cross-sectional view of a semiconductor device as a comparative form of the first embodiment.

FIG. 3 is a schematic cross-sectional view of a semiconductor device 800 as a comparative form of this embodiment. In the semiconductor device 800, the first semiconductor chip 24, the second semiconductor chip 26, and the third semiconductor chip 28 are provided on one base material 9 formed integrally. Then, the electrical characteristics of the first semiconductor chip 24, the second semiconductor chip 26, and the third semiconductor chip 28 are collectively confirmed by using a tester.

As described above, 50 or more semiconductor chips may be provided the interior of the one semiconductor device 100. This is to maximize a current rating of the semiconductor device 100. However, as the number of semiconductor chips is increased, the possibility that defective semiconductor chips are mixed is al so increased. If even one defective semiconductor chip is mixed into the semiconductor device 100, the semiconductor device 100 itself becomes a defective semiconductor device particular, as compared to an Si-based semiconductor chip, a semiconductor chip including SiC or a nitride semiconductor is low in yield. For this reason, how to obtain a semiconductor device with improved yield has been a problem.

In the semiconductor device 100 of this embodiment, the semiconductor chips are provided on (above) the separated respective base materials. In a case where the electrical characteristics of the semiconductor chips are determined to be good, the semiconductor device is manufactured by bonding the side surfaces of the respective base materials. Accordingly, the electrical characteristics of the semiconductor chips can be checked in advance, thus it is possible to manufacture the semiconductor device by removing the defective semiconductor chips. For this reason, it is possible to provide a semiconductor device with improved yield.

The frictional slide bonding is a method suitable for bonding the base materials of this embodiment.

In addition, as the semiconductor device 800 according to a comparative form, in a case where a plurality of the insulating plates (the first insulating plate 12 and the second insulating plate 14) are provided on one base material 9, there is a problem that, for example, a portion of the fourth bonding material 36 which is melted to bond the second insulating plate 14 is adhered as a bonding material 36a on the sixth metal plate 42 provided on the adjacent first insulating plate 12, and thus, causes unintended conduction failure.

In the semiconductor device 100 of this embodiment, at most only one insulating plate is provided on each of the base materials. In other words, a plurality of the insulating plates are not provided on each of the base materials. In this case, the bondings between the insulating plates and the base materials are separately performed. For this reason, the occurrence of the problem of adhering the bonding materials on the adjacent insulating plates to cause unintended conduction failure can be suppressed. For this reason, it is possible to provide a semiconductor device with improved yield.

According to the semiconductor device of this embodiment, it is possible to provide a semiconductor device with improved yield.

Second Embodiment

A second embodiment is different from the first embodiment in that, in a semiconductor device of this embodiment, the first, bonding material 30, the second bonding material 32, the third bonding material 34, and the fourth bonding material 36 are solders or contain solders, the first melting point of the first bonding material 30 is equal to the second melting point of the second bonding material 32, and the third melting point of the third bonding material 34 is equal to the fourth melting point of the fourth bonding material 36. Herein, description of contents overlapped with the first embodiment is omitted.

Figure 4:
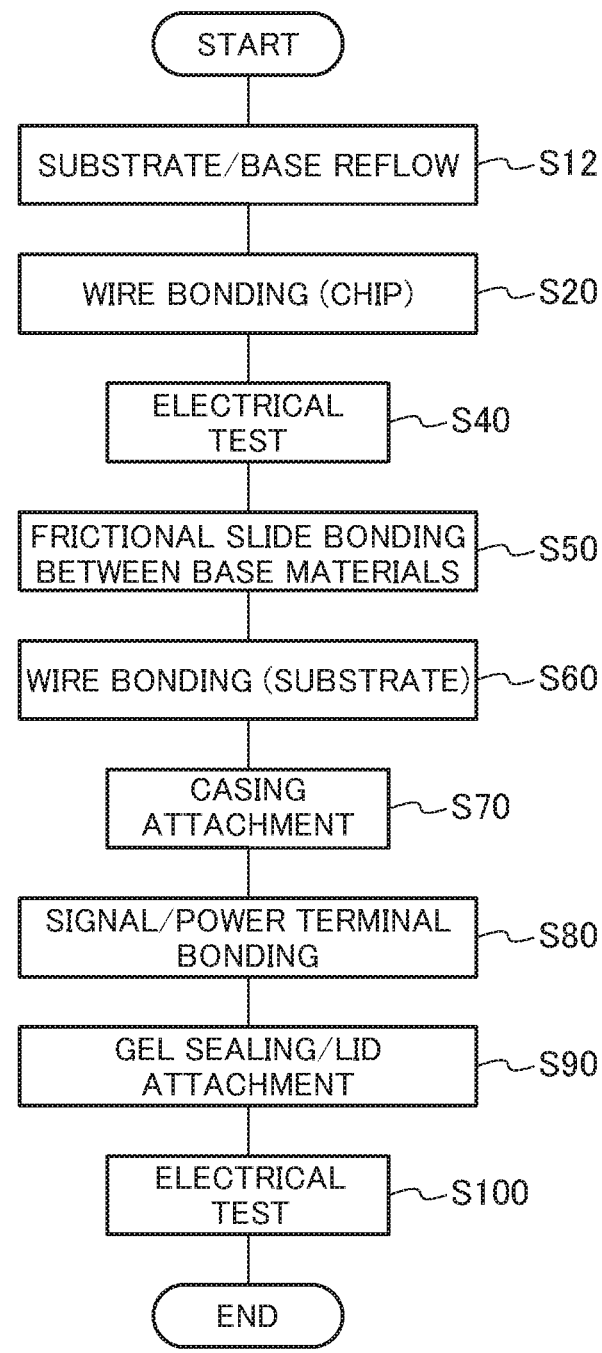
FIG. 4 is a flowchart illustrating a method of manufacturing a semiconductor device according to a second embodiment.

FIG. 4 is a flowchart illustrating a method of manufacturing a semiconductor device of this embodiment. FIG. 4 is different from FIG. 2 in that the "substrate reflow (chip mounting)" (S10) and the "base reflow" (S30) in FIG. 2 are collectively performed in "substrate/base reflow" (S12).

As the first bonding material 30, the second bonding material 32, the third bonding material 34, the fourth bonding material 36, and the sixth bonding material 35 of this embodiment, all the solders described in the first embodiment can be used, if the solders are, for example, solders having a melting point equal to an extent at v/hich reflow can be collectively performed in the same reflow furnace. In addition, if the melting points are equal, the compositions of the solders may be different. For example, based on the heat resistance required for parts used in the semiconductor device or the semiconductor device, it is also possible to select a solder to be used for the first bonding material 30, the second bonding material 32, the third bonding material 34, the fourth bonding material 36, and the sixth bonding material 35.

According to the semiconductor device of this embodiment, it is possible to provide a semiconductor device with improved yield.

Third Embodiment

A third embodiment is different from the first and second embodiments in that, in a semiconductor device of this embodiment, the first bonding material 30 and the third bonding material 34 contain a sintered material having electrical conductivity. Herein, description of contents overlapped with the first and second embodiments is omitted.

Figure 5:
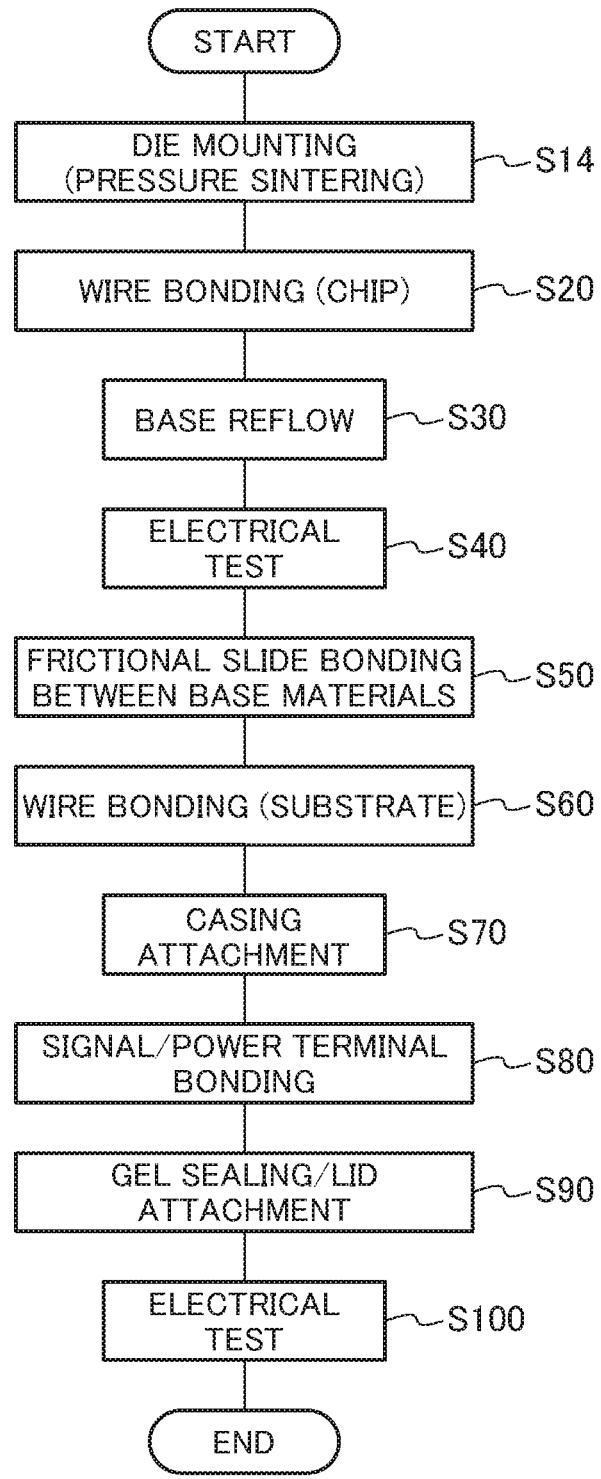
FIG. 5 is a flowchart illustrating a method of manufacturing a semiconductor device according to a third embodiment.

FIG. 5 is a flowchart illustrating a method of manufacturing a semiconductor device of this embodiment. FIG. 5 is different from FIG. 2 in that the "substrate reflow (chip mounting)" (S10) in FIG. 2 is replaced with "die mounting (pressure sintering)" (S14).

In this embodiment, as the "die mounting (pressure sintering)" (S14), a sintered material having electrical conductivity is used as the first bonding material 30, the third bonding material 34, and the sixth bonding material 35. And, the bonding of the first semiconductor chip 24 and the first metal plate 16, the bonding of the second semiconductor chip 26 and the second metal plate 18, and the bonding of the third semiconductor chip 28 and the second metal plate 18 are performed. As the sintered material having electrical conductivity, for example, a sintered material using particles of Ag, Cu, or the like is preferably used. Before the sintering, protective films are provided on the surfaces of fine particles (nanoparticles or microparticles) of, for example, Ag, Cu, or the tike, and the particles are dispersed in an organic solvent. Then, the protective films and the organic solvent are evaporated by the sintering, and the sintered material is formed.

In addition, a sintered material may further contain a resin. This is because it is possible to ensure the heat resistance by containing the resin. Herein, the resin is not particularly limited and, for example, an epoxy resin is preferably used.

In addition, in the case of a sintered material containing no resin, the sintering while applying pressure to the portion to be bonded may be performed by using, for example, a press machine or the like. In the case of a sintered material containing an epoxy resin, the sintering may be performed without applying pressure as described above. In addition, the sintering process is not limited to the above description.

According to the semiconductor device of this embodiment, it is possible to provide a semiconductor device with improved yield.

Fourth Embodiment

A fourth embodiment is different from the first to third embodiments in that, in a semiconductor device of this embodiment, the fourth metal plate 20, the fifth metal plate 22, the second bonding material 32, and the fourth bonding material 36 are not provided. Herein, description of contents overlapped with the first to third embodiments is omitted.

Figure 6:
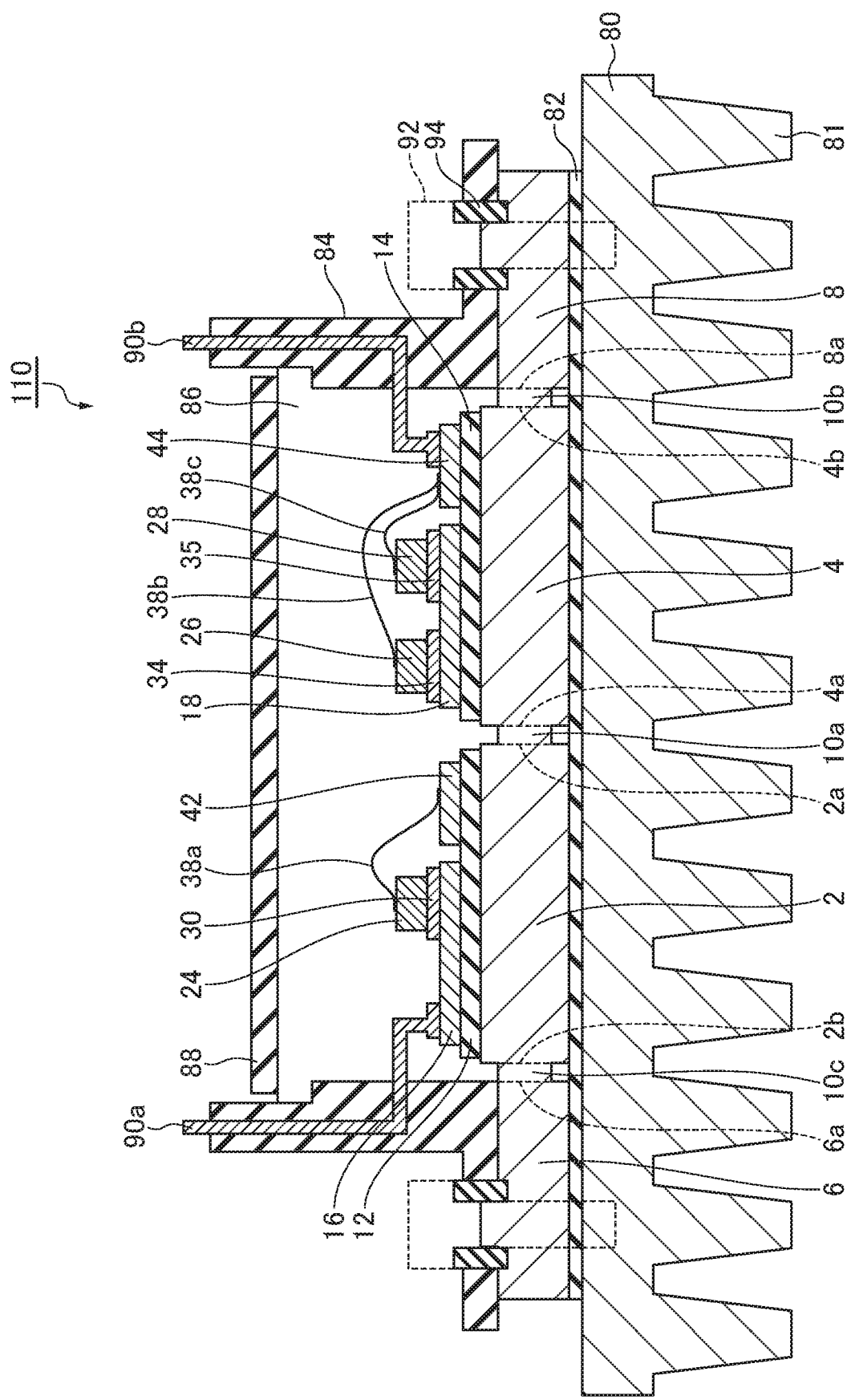
FIG. 6 is a schematic cross-sectional view of a semiconductor device according to a fourth embodiment.

FIG. 6 is a schematic cross-sectional view of a semiconductor device 110 of this embodiment. The first insulating plate 12 is directly bonded to the first base material 2. The second insulating plate 14 is directly bonded to the second base material 4. In this embodiment, an integration of the insulating plate and the base is used. This is useful to reduce the thermal resistance between the heat dissipation plate 80 and the first semiconductor chip 24, the second semiconductor chip 26 and the third semiconductor chip 28.

Figure 7:
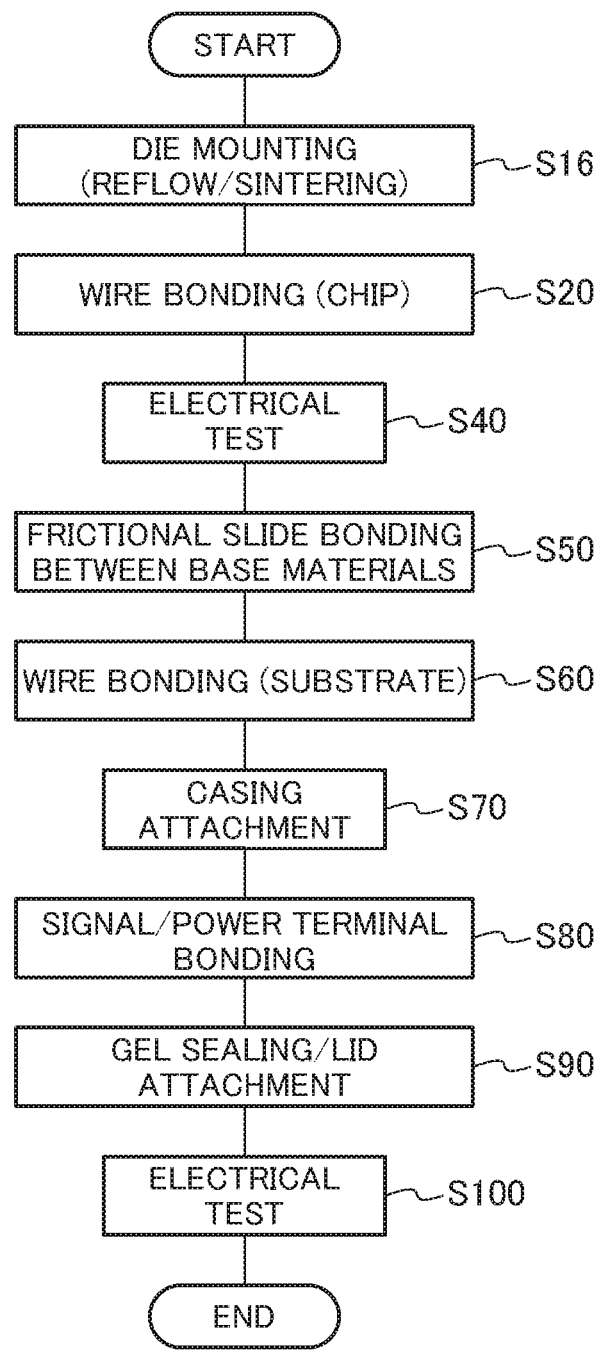
FIG. 7 is a flowchart illustrating a method of manufacturing the semiconductor device according to the fourth embodiment.

FIG. 7 is a flowchart illustrating a method of manufacturing the semiconductor device 110 of this embodiment. FIG. 7 is different from FIG. 2 in that the "substrate reflow (chip mounting)" (S10) and the "base reflow" (S30) in FIG. 2 are collectively performed in "die mounting (reflow/sintering). As the first bonding material. 30, the third bonding material 34, and the sixth bonding material 35, the solders described in the first and second embodiments may be used, and the sintered material described in the third embodiment may be used.

According to the semiconductor device 110 of this embodiment, it is possible to provide a semiconductor device with improved yield.

Fifth Embodiment

A fifth embodiment is different from the first to fourth embodiments in that, in a semiconductor device of this embodiment, the sintered material as described in the second embodiment is used as the first bonding material 30, the second bonding material 332, the third bonding material. 34, and the fourth bonding material 36. Herein, description of contents overlapped with the first to fourth embodiments is omitted.

Figure 8:
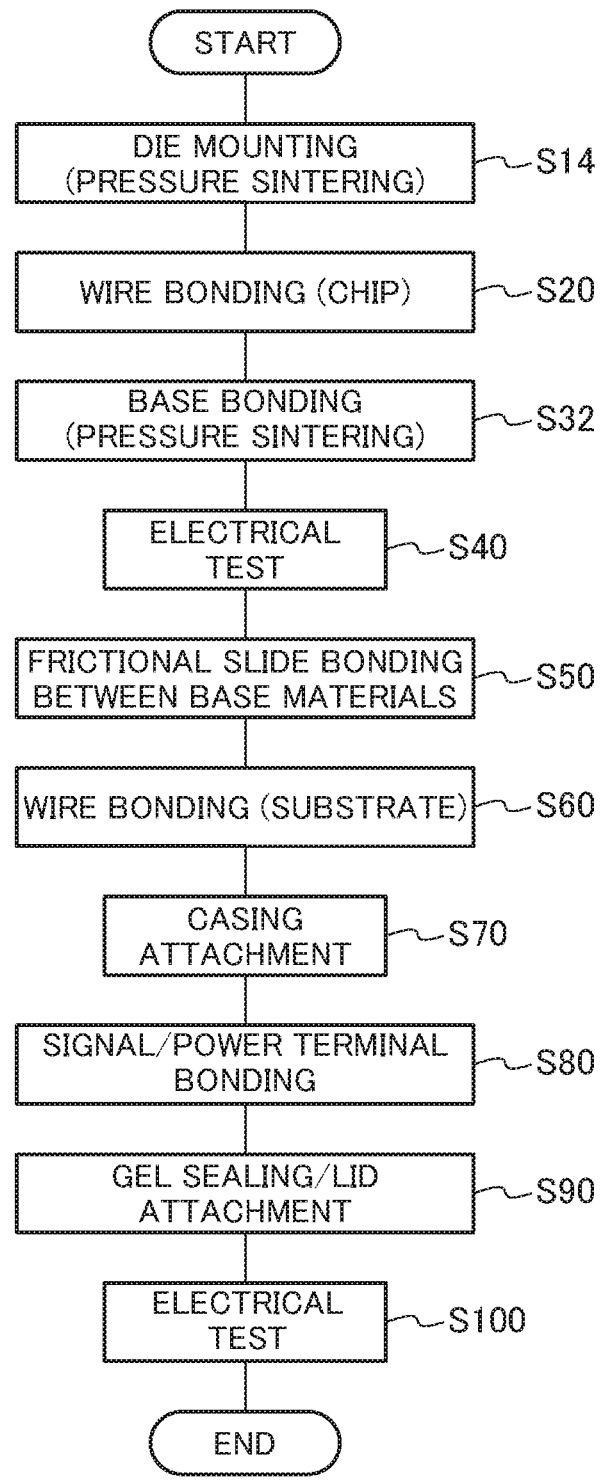
FIG. 8 is a flowchart illustrating a method of manufacturing a semiconductor device according to a fifth embodiment.

FIG. 8 is a flowchart illustrating a method of manufacturing a semiconductor device of this embodiment. FIG. 8 is different from FIG. 2 in that the "substrate reflow (chip mounting)" (810) is replaced with "die mounting (pressure sintering)" (S14), and the "base reflow" (S30) is replaced with "base bonding (pressure sintering)" (S32).

As described above, in the case of a sintered material containing no epoxy resin, sintering while applying pressure to the portions to be bonded may be performed by using, for example, a press machine or the like. In this case, in order to obtain stable bonding, it is preferable that the surfaces of the first base material 2 and the second base material 4 being in contact with the second bonding material 32 and the third bonding material 34 are covered with Cu. or Ni Ag, and Pd (palladium).

According to the semiconductor device of this embodiment, it is possible to provide a semiconductor device with improved yield.

Sixth Embodiment

Figure 9:
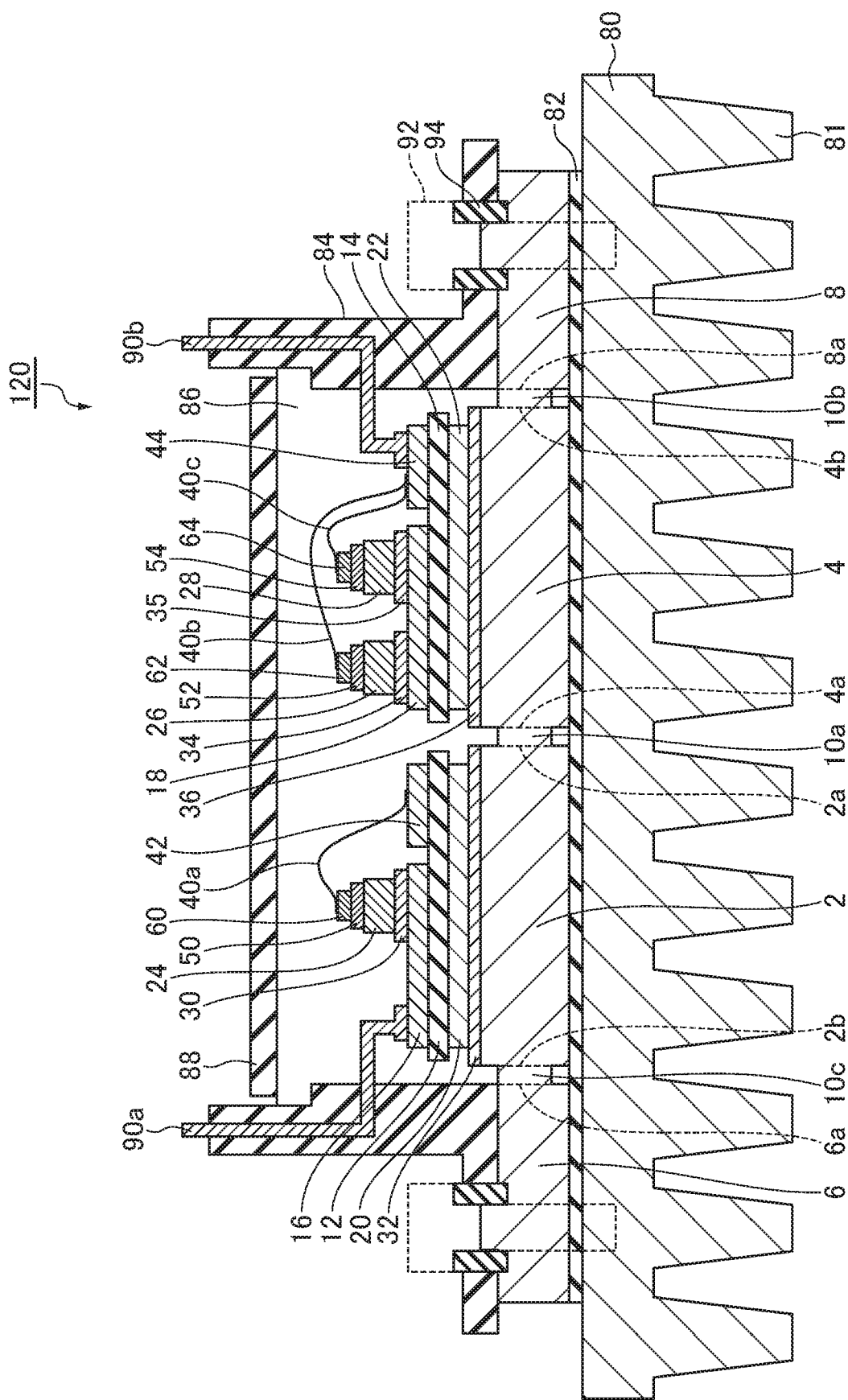
FIG. 9 is a schematic cross-sectional view of a semiconductor device according to a sixth embodiment.

A sixth embodiment is different from the first to fifth embodiments in that, a semiconductor device of this embodiment further includes a fifth bonding material 50 being provided on the first semiconductor chip 24 and containing a sintered material having electrical conductivity, a third metal plate 60 being provided on the fifth bonding material 50 and being bonded to the first semiconductor chip 24 by the fifth bonding material. 50, and a bonding wire (wire) 40a containing copper being provided on the third metal plate 60 and being connected to the third metal plate 60. Herein, description of contents overlapped with the first to fifth embodiments is omitted, FIG. 9 is a schematic cross-sectional view of a semiconductor device 120 of this embodiment.

The fifth bonding material 50 containing a sintered material having electrical conductivity is provided on the first semiconductor chip 24, a bonding material 52 containing a sintered material having electrical conductivity is provided on the second semiconductor chip 26, and a bonding material. 54 containing a sintered material having electrical conductivity is provided on the third semiconductor chip 28.

The third metal plate 60 is provided on the fifth bonding material 50. The first semiconductor chip 24 and the third metal plate 60 are bonded by the fifth bonding material 50. An eighth metal plate 62 is provided on the bonding material 52. The second semiconductor chip 26 and the eighth metal plate 62 are bonded by the bonding material 52. A ninth metal plate 64 is provided on the bonding material 54. The third semiconductor chip 28 and the ninth metal plate 64 are bonded by the bonding material 54. As the first bonding material 30, the second bonding material 32, the third bonding material 34, the fourth bonding material 36, the fifth bonding material 50, the sixth bonding material 35, the bonding material 52, and the bonding material 54, a sintered material containing no resin described in the second embodiment can be preferably used. In addition, a sintered material containing a resin may be used. Accordingly, it is possible to obtain a semiconductor device having a high heat-resistant temperature.

As the bonding wire 40a, a bonding wire 40b, and a bonding wire 40c, a wire containing copper is preferably used. This is because the heat-resistant temperature is increased.

Figure 10:
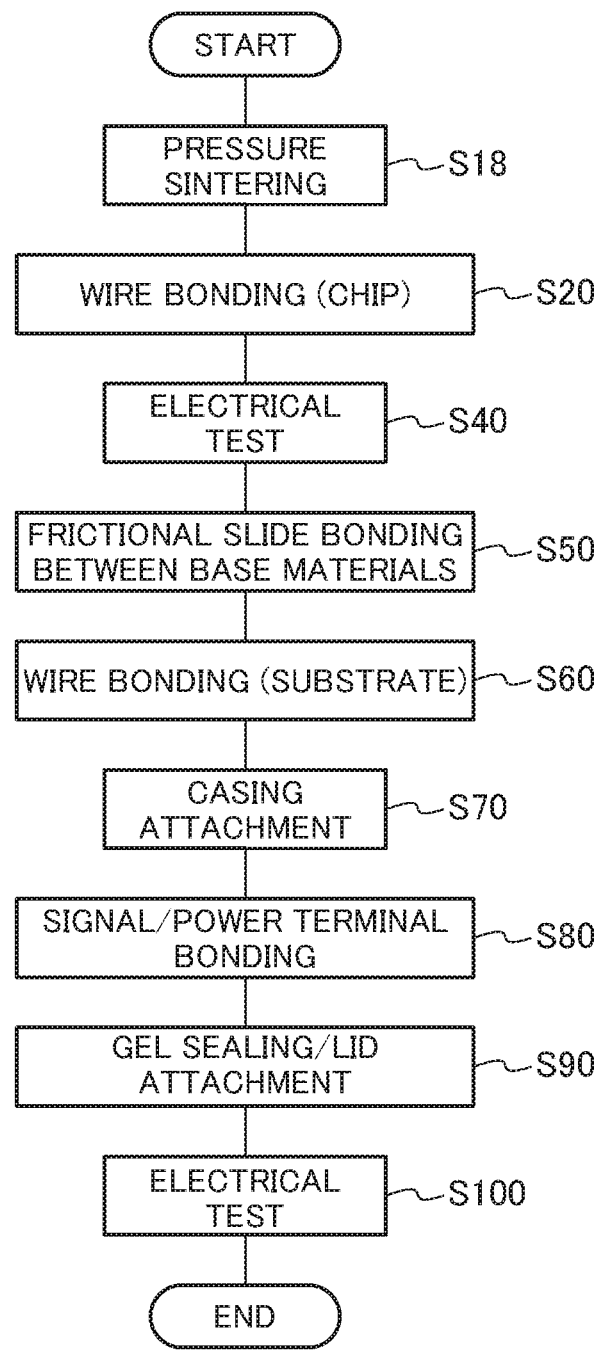
FIG. 10 is a flowchart illustrating a method of manufacturing the semiconductor device according to the sixth embodiment.

FIG. 10 is a flowchart illustrating a method of manufacturing the semiconductor device 120 of this embodiment. FIG. 10 is different from FIG. 2 in that the "substrate reflow (chip mounting)" (S10) is replaced with "pressure sintering" (S18), and the "base reflow" (S30) is removed. In the "pressure sintering" (S18), the first bonding material 30, the second bonding material 32, the third bonding material 34, the fourth bonding material 36, the fifth bonding material 50, the sixth bonding material 35, the bonding material 52, and the bonding material 54 are formed by collectively sintering.

According to the semiconductor device 120 of this embodiment, it is possible to provide a semiconductor device with improved yield.

Seventh Embodiment

A seventh embodiment is different from the first to sixth embodiments in that, in a semiconductor device of this embodiment, an aggregate 70 is provided inside the base material. Herein, description of contents overlapped with the first to sixth embodiments is omitted.

Figure 11:
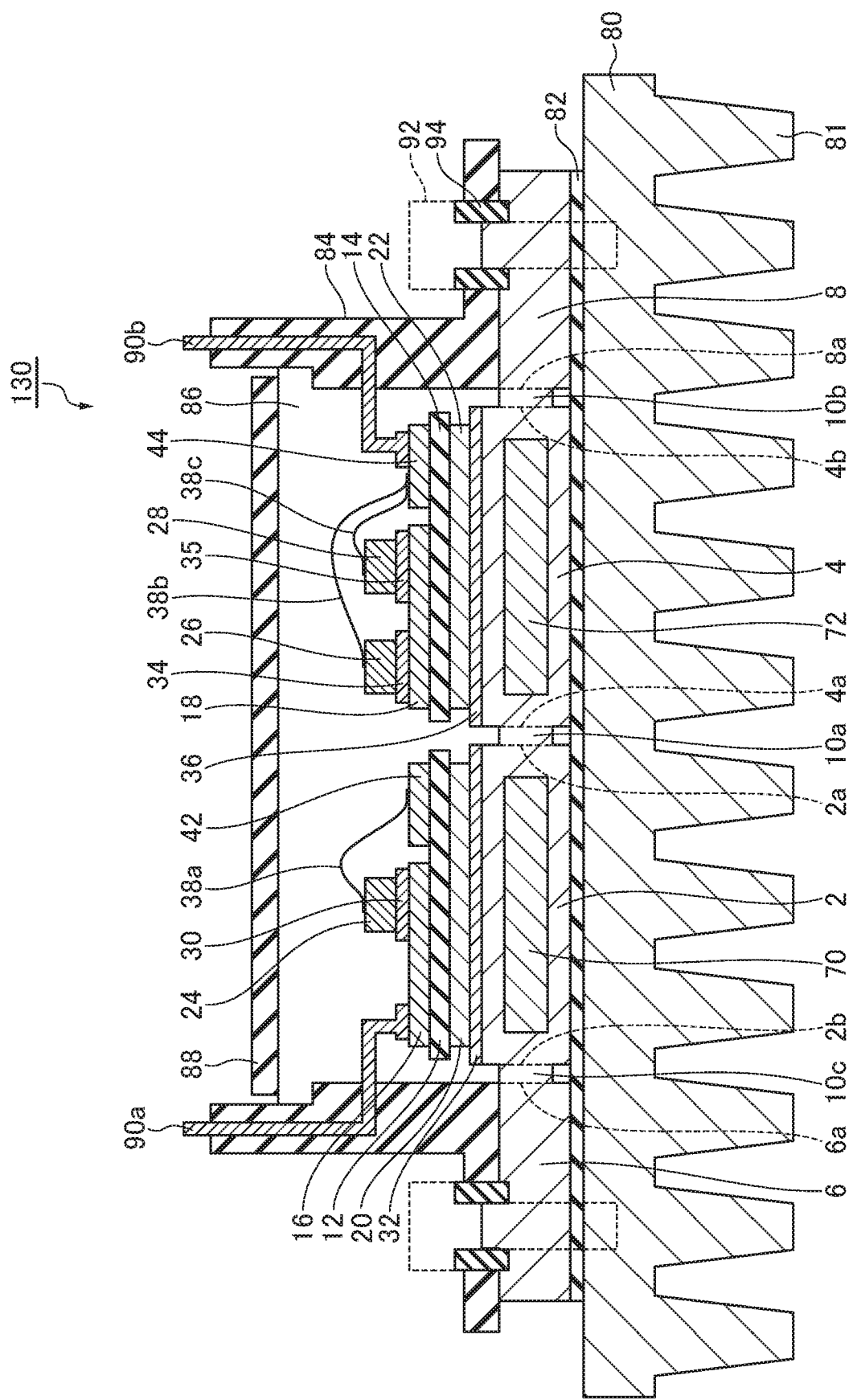
FIG. 11 is a schematic cross-sectional view of a semiconductor device according to a seventh embodiment.

FIG. 11 is a schematic cross-sectional view of a semiconductor device 130 of this embodiment. The aggregate 70 is, for example, SiC or the like and is used for increasing a strength of the base material. The base material of this embodiment is formed, for example, by molding the surface of the SiC with melted Al. In addition, of course, the aggregate 70 is not limited to the SiC.

According to the semiconductor device 130 of this embodiment, it is possible to provide a semiconductor device with improved yield.

Eighth Embodiment

An eighth embodiment is different from the first to seventh embodiments in that, in a semiconductor device of this embodiment, the base bonding portion contains a resin provided between the first side surface and the second side surface, and the first side surface and the second side surface are bonded by the resin. Herein, description of contents overlapped with the first to seventh embodiments is omitted.

Figure 12:
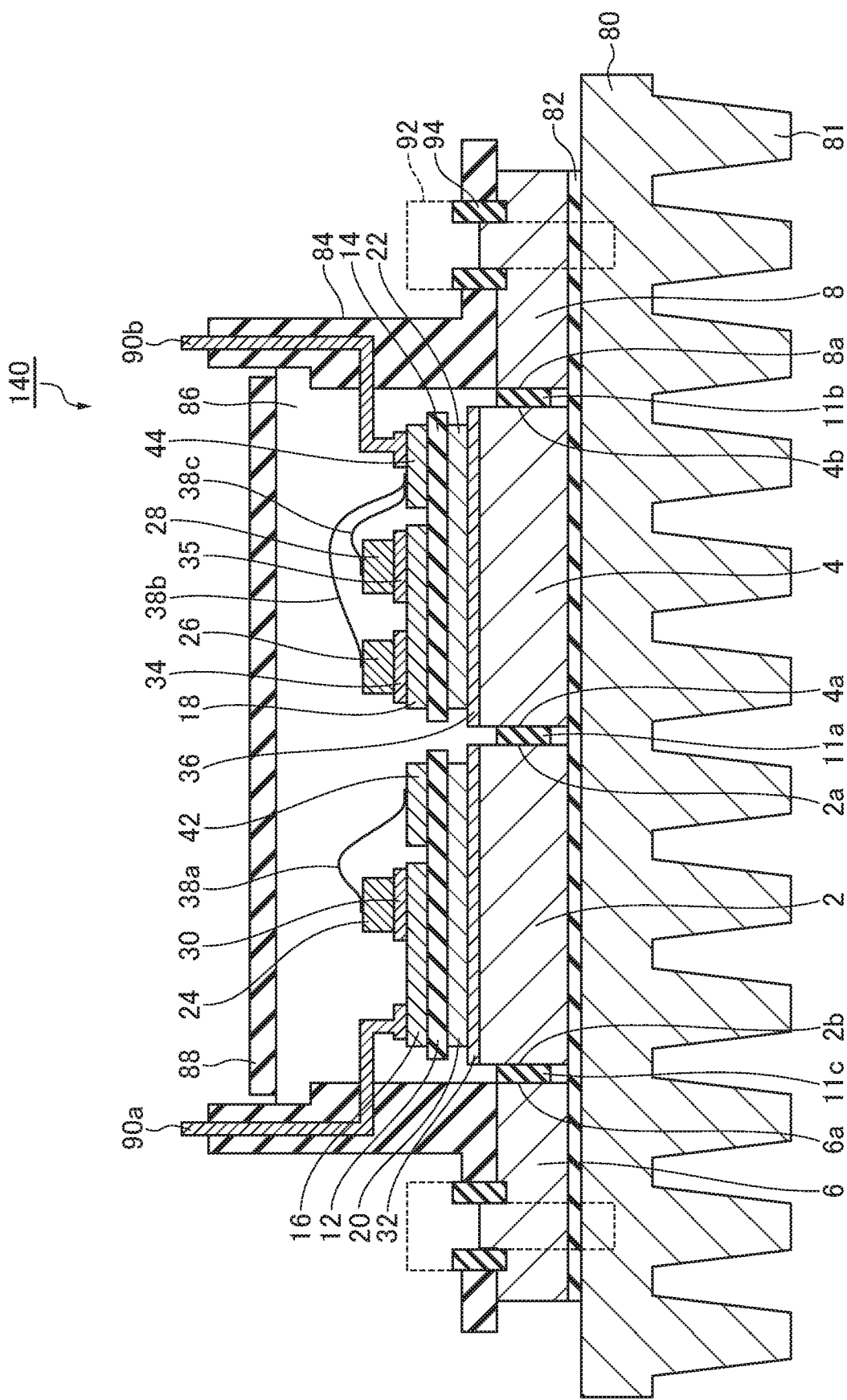
FIG. 12 is a schematic cross-sectional view of a semiconductor device according to an eighth embodiment.

FIG. 12 is a schematic cross-sectional view of a semiconductor device 140 of this embodiment. A resin 11a, a resin 11b, and a resin 11c are used to bond the base materials. Even in the case of using the resins, the bonding of the base materials can be satisfactorily performed.

As the resin 11 of this embodiment, for example, high heat-resistant resins such as a polyphenylsulfone resin, a polysulfone resin, a polyarylate resin, a polyetherimide resin, a polyetheretherketone resin, a polyphenylenesulfide resin, a polyethersulfone resin, a polyamideimide resin, a polytetrafluoroethylene resin, a polychlorotrifluoroethylene resin, or a polyvinylidenefluoride resin can be preferably used.

Figure 13:
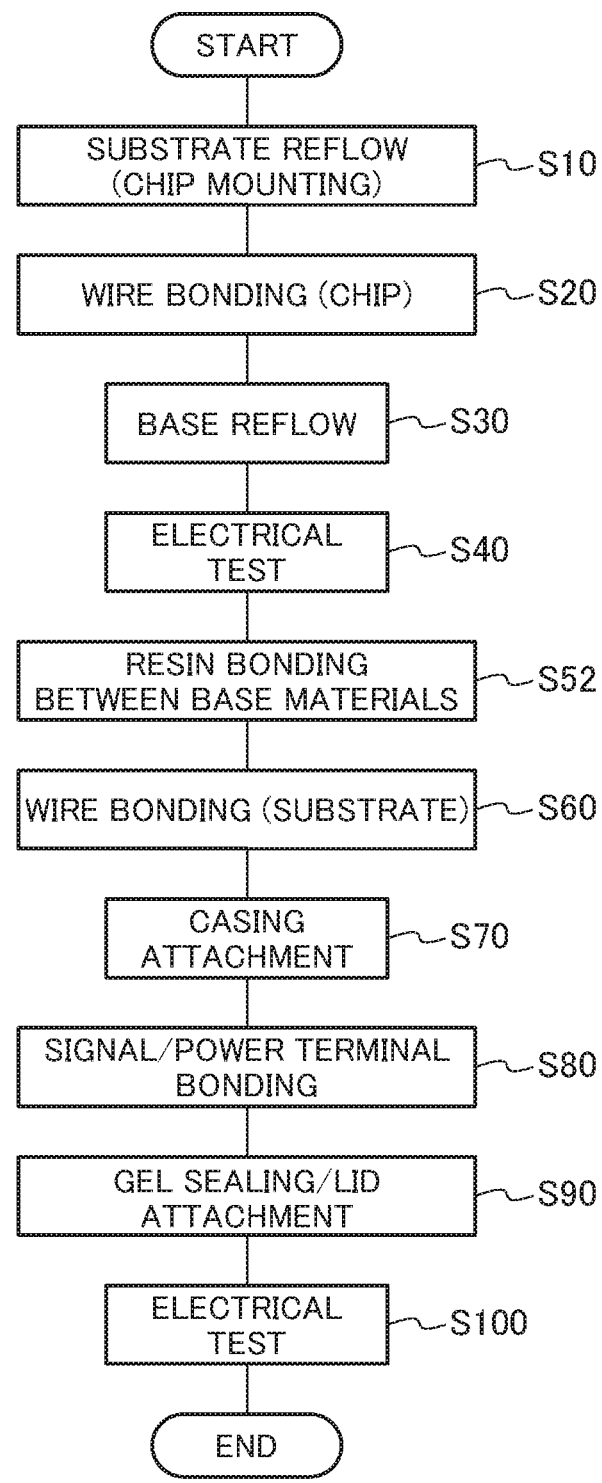
FIG. 13 is a flowchart illustrating a method of manufacturing the semiconductor device according to the eighth embodiment.

FIG. 13 is a flowchart illustrating a method of manufacturing the semiconductor device 140 of this embodiment. FIG. 13 is different from FIG. 2 in that the "frictional slide bonding between base materials" (S50) is replaced with "resin bonding between base materials" (S52).

According to the semiconductor device 140 of this embodiment, it is possible to provide a semiconductor device with improved yield.

While certain embodiments have been described, these embodiments have been presented by way of example only, and are not intended to limit the scope of the inventions. Indeed, SEMICONDUCTOR DEVICE described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first base material having a first side surface;
   a first semiconductor chip provided above the first base material;
   a first insulating plate provided between the first base material and the first semiconductor chip;
   a first metal plate provided between the first insulating plate and the first semiconductor chip;
   a first bonding material provided between the first metal plate and the first semiconductor chip, the first bonding material bonding the first metal plate and the first semiconductor chip;
   a second bonding material provided between the first base material and the first insulating plate, the second bonding material disposed between the first base material and the first insulating plate;
   a second base material having a second side surface;
   a second semiconductor chip provided above the second base material;
   a second insulating plate provided between the second base material and the second semiconductor chip;
   a second metal plate provided between the second insulating plate and the second semiconductor chip;
   a third bonding material provided between the second metal plate and the second semiconductor chip, the third bonding material bonding the second metal plate and the second semiconductor chip;
   a fourth bonding material provided between the second base material and the second insulating plate, the fourth bonding material bonding the second base material and the second insulating plate; and
   a first base bonding portion provided between the second side surface and the first side surface and bonded to the first side surface and the second side surface.

2. The semiconductor device according to claim 1, wherein the first base bonding portion is formed by friction stir welding of the second side surface and the first side surface.

3. The semiconductor device according to claim 1, wherein the first base bonding portion contains a resin provided between the second side surface and the first side surface, and wherein the second side surface and the first side surface are bonded by the resin.

4. The semiconductor device according to claim 1, wherein a plurality of the insulating plates are not provided on each of the first base material and the second base material.

5. The semiconductor device according to claim 1, wherein the first bonding material, the second bonding material, the third bonding material, and the fourth bonding material contain solders, wherein a first melting point of the first bonding material is higher than a second melting point of the second bonding material, and wherein a third melting point of the third bonding material is higher than a fourth melting point of the fourth bonding material.

6. The semiconductor device according to claim 5, wherein the first melting point is higher by 50° C. or more than the second melting point, and wherein the third melting point is higher by 50° C. or more than the fourth melting point.

7. The semiconductor device according to claim 1, wherein the first bonding material, the second bonding material, the third bonding material, and the fourth bonding material contain solders, wherein a first melting point of the first bonding material is equal to a second melting point of the second bonding material, and wherein a third melting point of the third bonding material is equal to a fourth melting point of the fourth bonding material.

8. The semiconductor device according to claim 1, wherein the first bonding material or the third bonding material contains a sintered material having electrical conductivity.

9. The semiconductor device according to claim 8, wherein the second bonding material or the fourth bonding material contains a sintered material having electrical conductivity.

10. The semiconductor device according to claim 9, wherein the first bonding material, the second bonding material, the third bonding material, or the fourth bonding material further contains a resin.

11. The semiconductor device according to claim 1, further comprising:
    a fifth bonding material provided on the first semiconductor chip and containing a sintered material having electrical conductivity;
    a third metal plate provided on the fifth bonding material and bonded to the first semiconductor chip by the fifth bonding material; and
    a wire provided on the third metal plate, the wire being connected to the third metal plate, and the wire containing copper.

12. The semiconductor device according to claim 1, further comprising a fourth metal plate provided between the second bonding material and the first insulating plate, wherein the second bonding material bonds the first insulating plate and the first base material via the fourth metal plate.

13. The semiconductor device according to claim 1, wherein the first base material further has a third side surface, wherein the second base material further has a fourth side surface, and wherein the semiconductor device further comprises:
    a third base material having a fifth side surface;
    a fourth base material having a sixth side surface;
    a second base bonding portion provided between the fourth side surface and the sixth side surface and bonded to the fourth side surface and the sixth side surface;

a third base bonding portion provided between the third side surface and the fifth side surface and bonded to the third side surface and the fifth side surface; and a heat dissipation plate provided under the first base material, the second base material, the third base material, and the fourth base material and fixed to the third base material and the fourth base material by using screws.

14. The semiconductor device according to claim 13, wherein the second base bonding portion is formed by friction stir welding of the fourth side surface and the sixth side surface, and wherein the third base bonding portion is formed by friction stir welding of the fifth side surface and the third side surface.

15. The semiconductor device according to claim 1, wherein the first semiconductor chip and the second semiconductor chip contain a compound semiconductor.

16. The semiconductor device according to claim 1, further comprising an aggregate provided inside the first base material or the second base material.

* * * * *